(12) United States Patent
Kim (10) Patent No.: US 7,847,308 B2
(45) Date of Patent: Dec. 7, 2010

(54) SEMICONDUCTOR LIGHT EMITTING DEVICE

(75) Inventor: Deung Kwan Kim, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/144,448

(22) Filed: Jun. 23, 2008

(65) Prior Publication Data
US 2008/0315233 A1    Dec. 25, 2008

(30) Foreign Application Priority Data
Jun. 21, 2007    (KR) .................... 10-2007-0060942

(51) Int. Cl.
*H01L 33/00* (2010.01)
(52) U.S. Cl. ................... 257/98; 257/94; 257/103; 257/E33.028; 257/E33.068
(58) Field of Classification Search ............... None
See application file for complete search history.

(56) References Cited
U.S. PATENT DOCUMENTS
2005/0121679 A1* 6/2005 Nagahama et al. ......... 257/94
2006/0237733 A1* 10/2006 Yamada ..................... 257/97

* cited by examiner

*Primary Examiner*—Victor A Mandala
*Assistant Examiner*—Whitney Moore
(74) *Attorney, Agent, or Firm*—Birch, Stewart, Kolasch & Birch, LLP (57) ABSTRACT

Provided is a semiconductor light emitting device. The semiconductor light emitting device comprises a first conductive type semiconductor layer, an active layer, a second conductive type super lattice layer, and a second conductive type semiconductor layer. The active layer is formed on the first conductive type semiconductor layer. The second conductive type super lattice layer comprises a second conductive type nitride layer and an undoped nitride layer on the active layer. The second conductive type semiconductor layer is formed on the second conductive type super lattice layer.

17 Claims, 6 Drawing Sheets

SEMICONDUCTOR LIGHT EMITTING DEVICE

CROSS-REFERENCE TO RELATED APPLICATIONS

The present application claims priority under 35 U.S.C. 119 and 35 U.S.C. 365 to Korean Patent Application No. 10-2007-0060942 (filed on Jun. 21, 2007), which is hereby incorporated by reference in its entirety.

BACKGROUND

A III-V group nitride semiconductor has been variously used for an optical device such as blue/green light emitting diodes (LEDs), a high speed switching device such as a metal semiconductor field effect transistor (MOSFET) and a hetero junction filed effect transistor (HEMT), a light source of an illumination or a display apparatus, and the like. In particular, a light emitting device using an III group nitride semiconductor has a direct transition-type bandgap corresponding to the range of visible rays to ultraviolet rays, and can perform high efficient light emission.

The nitride semiconductor has been mainly utilized as a LED or a laser diode (LD), and research for improving the manufacturing process or light efficiency has been conducted.

SUMMARY

Embodiments provide a semiconductor light emitting device in which a second conductive type super lattice layer comprises an undoped nitride layer, and the second conductive type super lattice layer prevents a second conductive dopant from being inter-diffused to the active layer.

Embodiments provide a semiconductor light emitting device in which an undoped GaN layer can be provided in a super lattice layer formed on an active layer to adjust a doping amount of a p-type dopant.

An embodiment provides a semiconductor light emitting device comprising: a first conductive type semiconductor layer: an active layer on the first conductive type semiconductor layer; a second conductive type super lattice layer comprising a second conductive type nitride layer and an undoped nitride layer on the active layer; and a second conductive type semiconductor layer on the second conductive type super lattice layer.

An embodiment provides a semiconductor light emitting device comprising: an n-type semiconductor layer; an active layer on the n-type semiconductor layer; a p-type super lattice layer comprising a second conductive type nitride layer and an undoped GaN layer on the active layer; and a p-type semiconductor layer on the p-type super lattice layer.

An embodiment provides a semiconductor light emitting device comprising: a reflective electrode layer; a second conductive type semiconductor layer on the reflective electrode layer; a second conductive type super lattice layer comprising a second conductive type nitride layer and an undoped GaN layer on the second conductive type semiconductor layer; an active layer on the second conductive type super lattice layer; a first conductive type semiconductor layer on the active layer; a first electrode layer on the first conductive type semiconductor layer.

DETAILED DESCRIPTION OF THE EMBODIMENTS

Hereinafter, a semiconductor light emitting device according to embodiments will be described with reference to the accompanying drawings.

Figure 1:
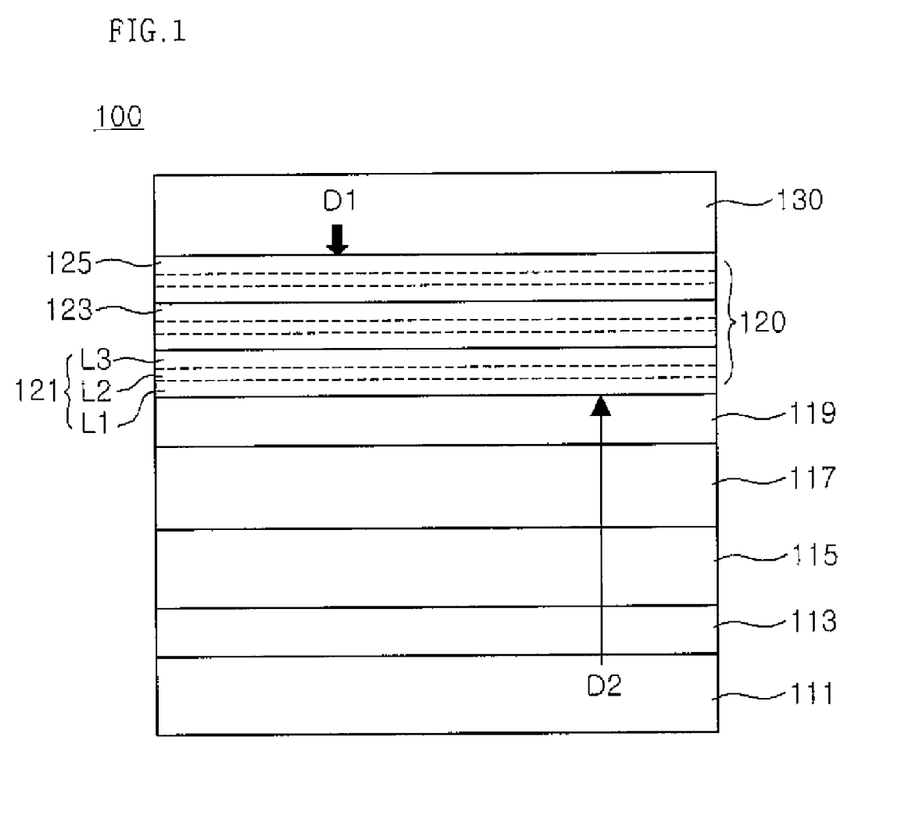
FIG. 1 is a side cross-sectional view of a semiconductor light emitting device according to an embodiment.

FIG. 1 is a side cross-sectional view of a semiconductor light emitting device according to an embodiment.

Referring to FIG. 1, a semiconductor light emitting device 100 comprises a substrate 111, a buffer layer 113, an undoped semiconductor layer 115, a first conductive type semiconductor layer 117, an active layer 119, a second conductive type super lattice layer 120, and a second conductive type semiconductor layer 130.

The substrate 111 may be formed of at least one of sapphire ($Al_2O_3$), SiC, Si, GaAs, GaN, ZnO, GaP, InP, and Ge. Also, the substrate 111 may comprise a substrate having a conductive characteristic. A concave-convex pattern may be formed on and/or under the substrate 111. The concave-convex pattern may have one of stripe, lens, cylindrical, and cone shapes.

A nitride semiconductor is grown on the substrate 111. Growth equipment may use an E-beam evaporator, a physical vapor deposition (PVD) apparatus, a chemical vapor deposition (CVD) apparatus, a plasma laser deposition (PLD) apparatus, a dual-type thermal evaporator, a sputtering apparatus, and a metal organic chemical vapor deposition (MOCVD) apparatus. However, the present disclosure is not limited to the equipment.

The buffer layer 113 may be formed on the substrate 111. The buffer layer 113 can mitigate lattice mismatch between a GaN material and a substrate material. The buffer layer 113 may be formed of at least one of GaN, InN, AlN, InGaN, AlGaN, InAlGaN, and AlInN.

The undoped semiconductor layer 115 may be formed on the buffer layer 113. The undoped semiconductor layer 115 may comprise an undoped GaN layer in which a first conductive type dopant or a second conductive type dopant is not added. The undoped semiconductor layer 115 serves as a substrate on which the nitride semiconductor is grown.

The buffer layer 113 and/or the undoped semiconductor layer 115 may be not formed, or may not exist in a final device.

The first conductive type semiconductor layer 117 is formed on the undoped semiconductor layer 115. The first conductive type semiconductor layer 117 may serve as a first electrode contact layer. The first conductive type semiconductor layer 117 may be formed of at least one of GaN, InN, AlN, InGaN, AlGaN, InAlGaN, and AlInN. The first conductive type dopant is doped into the first conductive type semiconductor layer 117. The first conductive type dopant comprises Si, Ge, Sn, Se, and Te.

For example, the first conductive type semiconductor layer 117 may comprise an n-type GaN layer having a predetermined thickness by supplying silane gas ($SiH_4$) comprising an n-type dopant such as $NH_3$, TMGa (or TEGa), and Si.

The active layer 119 is formed on the first conductive type semiconductor layer 117. The active layer 119 may comprise a single quantum well structure or a multi-quantum well (MQW) structure. The active layer 119 may be formed of InGaN/GaN, InGaN/AlGaN, InAlGaN/InAlGaN, or AlGaN/GaN.

A first conductive type AlGaN layer may be formed between the first conductive type semiconductor layer 117 and the active layer 119. The first conductive type AlGaN layer may serve as an n-type clad layer.

The second conductive type super lattice layer 120 is formed on the active layer 119. The second conductive type super lattice layer 120 comprises a cycle of multilayer second conductive type nitride layers L1 and L2 and an undoped nitride layer L3. The multilayer second conductive type nitride layers L1 and L2 may comprise nitride layers of different elements, respectively. For example, a p-GaN layer L1 and a p-AlGaN layer L2 may be sequentially stacked, or the p-AlGaN layer L1 and the p-GaN layer L2 may be sequentially stacked. At least one of Mg, Zn, Ca, Sr, and Ba that are the p-type dopant may be added to the second conductive type dopant of the second conductive type nitride layers.

The undoped nitride layer L3 formed on the multilayer second conductive type nitride layers L1 and L2 may comprise the undoped GaN layer.

A cycle of p-GaN/p-AlGaN/un-GaN layers (L1/L2/L3) or a cycle of p-AlGaN/p-GaN/un-GaN layers (L1/L2/L3) may be repeated one time to twenty times to form the second conductive type super lattice layer 120. The one cycle may comprise a thickness ranging from about 10 Å to about 80 Å. The second conductive type super lattice layer 120 may comprise a thickness ranging from about 10 Å to about 1000 Å, preferably, a thickness of about 200 Å.

Hereinafter, for the convenience in description, the second conductive type super lattice layer 120 comprises the cycle of the p-GaN/p-AlGaN/un-GaN layers (L1/L2/L3). Also, a super lattice structure (SLS) 121, 123, and 125 comprising three cycles will be described.

The second conductive type super lattice layer 120 comprises a first super lattice structure 121, a second super lattice structure 123, and a third super lattice structure 125. The first super lattice structure 121 is formed on the active layer 119. The second super lattice structure 123 is formed on the first super lattice structure 121. The third super lattice structure 125 is formed on the second super lattice structure 123. The cycle of the p-GaN/p-AlGaN/un-GaN layers (L1/L2/L3) is repeated three times at a temperature ranging from about 800° C. to about 1000° C. to form the first, second, and third super lattice structures 121, 123, and 125. The first, second, and third super lattice structures 121, 123, and 125 may comprise a thickness ranging from about 30 Å to about 240 Å.

The p-GaN layer L1 of the super lattice structures 121, 123, and 125 is grown at a temperature ranging from about 800° C. to about 1000° C. using hydrogen as a carrier gas. Here, trimethyl gallium (TMGa) gas or triethyl gallium (TEGa) gas is used as a source gas for gallium (Ga). Ammonia ($NH_3$) gas, monomethyl hydrazine (MMHy) gas, or dimethyl hydrazine (DMHy) gas is used as a source gas for nitrogen (N) Bis (cyclopentadienyl)magnesium ($CP_2Mg$) gas is used as a source gas for magnesium (Mg).

The p-AlGaN layer L2 of the super lattice structures 121, 123, and 125 is grown at a temperature ranging from about 800° C. to about 1000° C. using hydrogen as a carrier gas. Here, TMGa gas or TEGa gas is used as a source gas for Ga. Trimethylalluminum (TMAl) gas or triethylaluminum (TEAl) gas is used as a source gas for aluminum (Al). NH3, MMHy gas, or DMHy gas is used as a source gas for N. $CP_2Mg$ gas is used as a source gas for Mg.

The undoped GaN layer L3 of the super lattice structures 121, 123, and 125 is grown at a temperature ranging from about 800° C. to about 1000° C. using hydrogen as a carrier gas. Here, TMGa gas or TEGa gas is used as a source gas for Ga. $NH_3$ gas, MMHy gas, or DMHy gas is used as a source gas for N. However, a supply of $CP_2Mg$ gas used as a source gas for Mg and TMAl gas or TEAl gas used as a source gas for Al is stopped.

The undoped GaN layer L3 of the super lattice structures 121, 123, and 125 serves as a buffer of the p-type dopant (e.g., Mg) of the p-AlGaN layer L2, the p-GaN layer L1 and a the second conductive type semiconductor layer 130 thereon. A doping concentration of the p-type dopant can be adjusted using the undoped GaN layer L3. In addition, it can prevent that a layer boundary between the super lattice structures collapses due to an overdoped p-type dopant. The doping concentration of the p-type dopant doped into a p-type semiconductor layer may increase by using the un-GaN layer L3. The doping concentration of the p-type dopant can be adjusted to control a surface roughness and improve luminance uniformity.

A second conductive type clad layer (not shown) may be formed between the second conductive type super lattice layer 120 and the active layer 119. The second conductive type clad layer may comprise the p-AlGaN layer or the p-AlInGaN layer.

The second conductive type semiconductor layer 130 is formed on the second conductive type super lattice layer 120. The second conductive type semiconductor layer 130 may serve as a p-type semiconductor layer doped with the p-type dopant. The p-type semiconductor layer may be formed of one of compound semiconductors such as GaN, InN, AlN, InGaN, AlGaN, InAlGaN, and AlInN. At least one of Mg, Zn, Ca, Sr, and Ba may be added to the p-type dopant.

The second conductive type super lattice layer 120 serves as a blocking layer preventing the p-type dopant doped into the second conductive type semiconductor layer 130 from being inter-diffused (direction D1) to the active layer 119. Also, the second conductive type super lattice layer 120 serves as a surface recovery layer reducing a stress (direction D2) transferred into thin films from the substrate 111. Therefore, an epitaxial layer having a high quality can be obtained.

The second conductive type super lattice layer 120 prevents an Mg dopant from being introduced into the active layer 119 to further stabilize the active layer 119 compared to that in the case where the second conductive type super lattice layer 120 does not exist. In addition, more than holes may be provided in the active layer 119.

Figure 7:
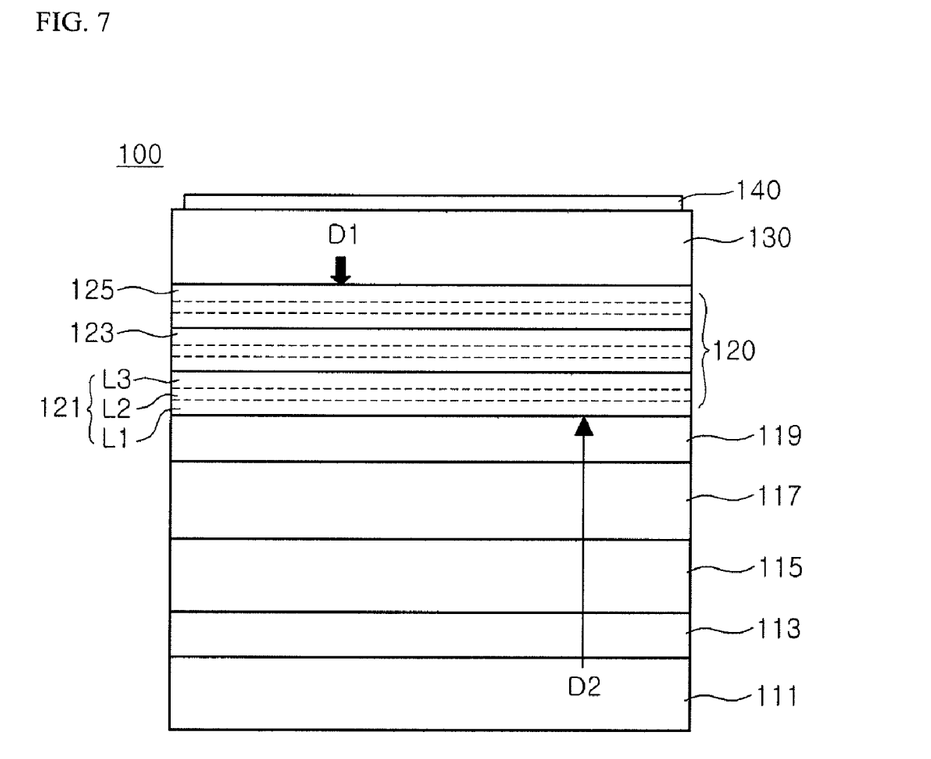
FIG. 7 is a side cross-sectional view of a semiconductor light emitting device according to another embodiment of FIG. 1.

As shown in FIG. 7, a transparent electrode layer 140 may be formed on the second conductive type semiconductor layer 130. The transparent electrode layer 140 may be formed of one of ITO, ZnO, IrOx, RuOx, and NiO. As shown in FIGS. 1 and 7, the first conductive type semiconductor layer 117 may serve as an n-type semiconductor layer, and the second conductive type semiconductor layer 130 may serve as the p-type semiconductor layer in the semiconductor light emitting device 100, or may be implemented in reverse structure. Also, the n-type semiconductor layer or the p-type semiconductor layer may be formed on the second conductive type semiconductor layer 130. Therefore, the semiconductor light emitting device 100 may comprise one structure of an N-P junction structure, a P-N junction structure, an N-P-N junction structure, and a P-N-P junction structure.

Figure 2:
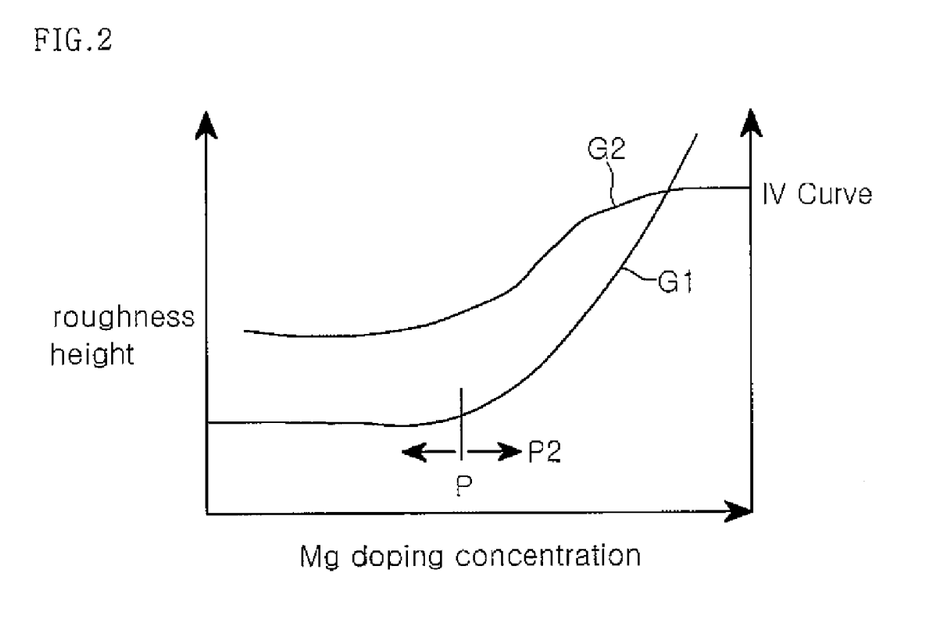
FIG. 2 is a graph illustrating surface roughness and luminance property according to a doping concentration of an Mg dopant in a second conductive type super lattice layer according to an embodiment.

FIG. 2 is a graph illustrating surface roughness and luminance property according to a doping concentration of an Mg dopant in a second conductive type super lattice layer according to an embodiment. Although the Mg dopant is used as one example, the present disclosure is not limited thereto. For example, different p-type dopant may be used.

Referring to FIG. 2, a second conductive type super lattice layer according to an embodiment comprises an undoped GaN layer to prevent the p-type dopant from being inter-diffused to the active layer.

Although an amount of an Mg dopant doped into the p-type semiconductor layer, e.g., the p-AlGaN layer and the p-type electrode contact layer, is deviated from a critical point P to cause overdoping (direction P2), the undoped GaN layer prevents a inter-diffusion of the Mg dopant. Thus, a height of a surface roughness increases up to a certain optimum point to improve luminance IV curve. In a graph of FIG. 2, G1 denotes a surface roughness graph according to a doping concentration of the Mg dopant, and G2 denotes a luminance graph.

Figure 3:
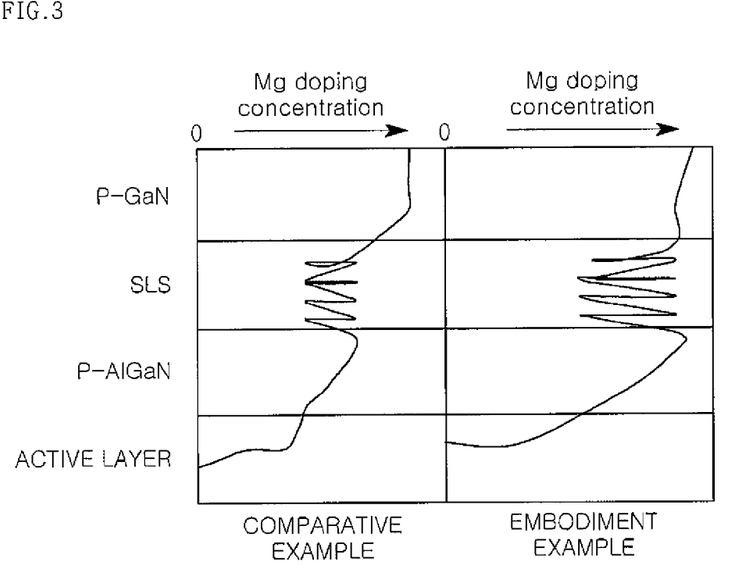
FIG. 3 is a graph for comparing an Mg doping profile of a comparative example with that of an example in a second conductive type super lattice layer.

FIG. 3 is a graph for comparing an Mg doping profile of a comparative example with that of an embodiment example in a second conductive type super lattice layer.

Referring to FIG. 3, a super lattice layer SLS of a comparative example comprises a structure with a cycle of p-AlGaN/p-GaN layers. A second conductive type super lattice layer of an example comprises a structure in which a cycle of p-GaN/p-AlGaN/un-GaN layers is repeated three times. A structure in which a p-AlGaN layer that is a clad layer is formed between an active layer and the super lattice layer will be described in the comparative example and the example.

In the comparative example, the super lattice layer SLS comprises the p-AlGaN/p-GaN layers. Since a layer serving as a buffer of an Mg dopant does not exist, a depth of a doping profile of the Mg dopant is shallow. Thus, when the Mg dopant is overdoped, a layer boundary of a super lattice structure collapses to allow the Mg dopant to be back-diffused into the active layer.

In the embodiment example, the second conductive type super lattice layer comprises the p-GaN/p-AlGaN/un-GaN layers inserting the un-GaN layer. Since the un-GaN layer serves as a buffer of the Mg dopant, the depth of the doping profile of the Mg dopant can be deep. An amount of the Mg dopant doped of the p-AlGaN layer, the p-GaN layer and the second conductive type semiconductor layer formed on the un-GaN layer can increase. Therefore, a density or a height of a self-generated roughness in the second conductive type semiconductor layer can increase.

Figure 4:
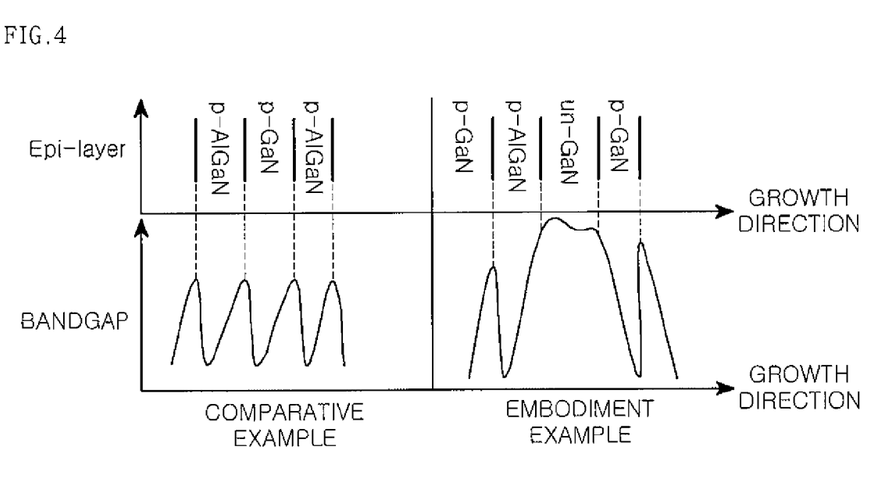
FIG. 4 is a graph for comparing a band gap of a comparative example with that of an example in a second conductive type super lattice layer.

FIG. 4 is a graph for comparing a band gap BANDGAP of a comparative example with that of an embodiment example in a second conductive type super lattice layer.

Referring to FIG. 4, a comparative example comprises a super lattice structure repeated with a cycle of p-AlGaN/p-GaN layers on an epitaxial layer. A band gap BANDGAP has a uniform level.

An embodiment example comprises super lattice structures in which a cycle of p-GaN/p-AlGaN/un-GaN layers is repeated three times on the epitaxial layer. In the embodiment example, the un-GaN layer of the super lattice structures can prevent an inter-diffusion of the p-type dopant doped into the p-AlGaN layer, the p-GaN layer and the second conductive type semiconductor layer thereon. An amount of the Mg dopant doped of the p-AlGaN layer, the p-GaN layer and the second conductive type semiconductor layer formed on the un-GaN layer can increase.

Figure 5:
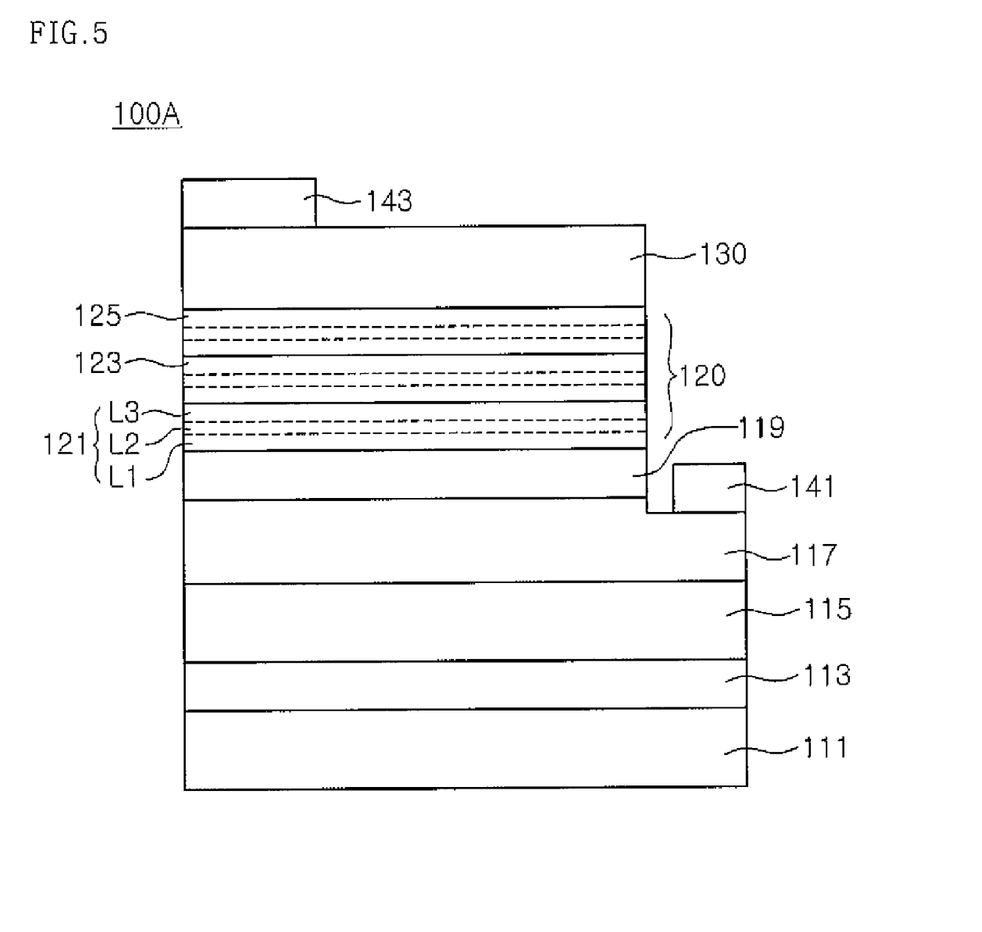
FIG. 5 is a side cross-sectional view of a first semiconductor light emitting device using FIG. 1.

FIG. 5 is a side cross-sectional view of a first semiconductor light emitting device using FIG. 1.

Referring to FIG. 5, a first semiconductor light emitting device 100A comprises a horizontal-type light emitting device. A first electrode 141 is formed on a first conductive type semiconductor layer 117. A second electrode 143 is formed on the second conductive type semiconductor layer 130.

Figure 6:
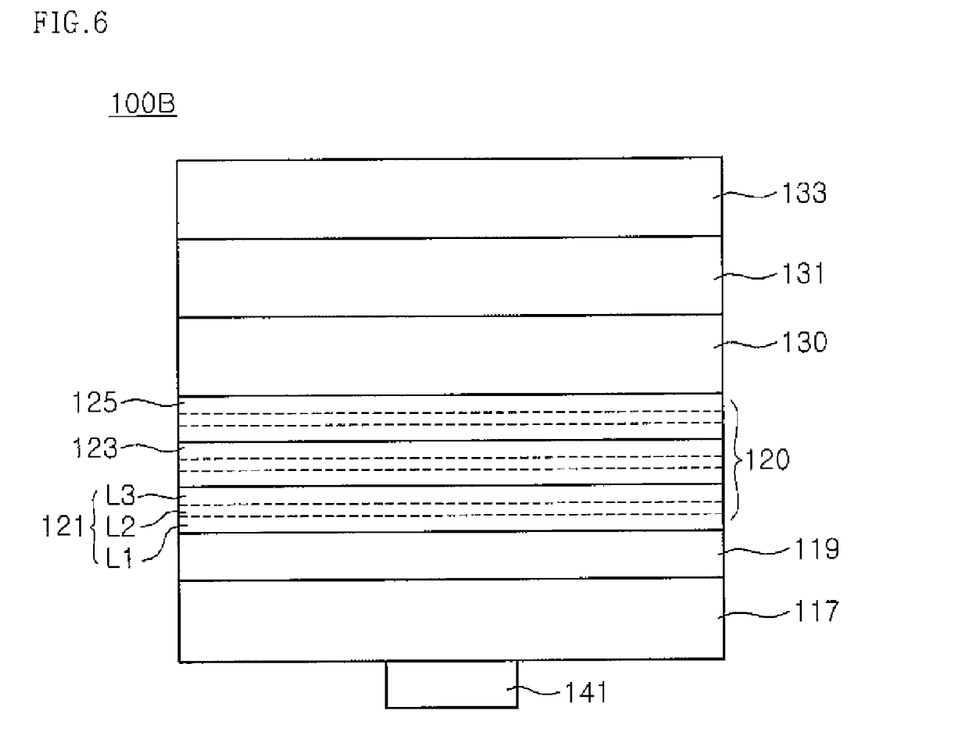
FIG. 6 is a side cross-sectional view of a second semiconductor light emitting device using FIG. 1.

FIG. 6 is a side cross-sectional view of a second semiconductor light emitting device using FIG. 1.

Referring to FIG. 6, a second semiconductor light emitting device comprises a vertical type semiconductor light emitting device. A reflective electrode layer 131 is formed on a second conductive type semiconductor layer 130. A conductive supporting substrate 133 may be formed on the reflective electrode layer 131. Also, an adhesion layer (not shown) may be formed between the reflective electrode layer 131 and the conductive supporting substrate 133.

The substrate 111, the buffer layer 113, and the undoped semiconductor layer 115 illustrated FIG. 1 are removed using a physical and/or chemical removing method. In the physical removing method, a laser beam having a predetermined wavelength is irradiated onto the substrate 111 to separate the substrate 111. The buffer layer 113 and the undoped semiconductor layer 115 may be removed using a wet or dry etching process. In the chemical removing method, an etching solution is injected into the buffer layer 113 to separate the substrate 111.

Thereafter, the first electrode 141 may be formed on the first conductive type semiconductor layer 117.

Although a compound semiconductor light emitting device comprising the P-N junction structure is used in the embodiments, the present disclosure is not limited thereto. For example, a compound semiconductor light emitting device comprising the P-N-P junction structure may be used. In the following description, it will be understood that when a layer (or film), a region, a pattern, or components is referred to as being 'on' or 'under' another substrate, layer (or film), region, or patterns, it can be directly on the other layer or substrate, or intervening layers may also be present.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
a first conductive type semiconductor layer;
an active layer on the first conductive type semiconductor layer;
a second conductive type super lattice layer comprising a cycle of a first GaN-based layer/an AlGaN-based layer/a second GaN-based layer or a cycle of the AlGaN-based layer/the first GaN-based layer/the second GaN-based layer, wherein the cycle is periodically repeated at least two times;
a second conductive type semiconductor layer on the second conductive type super lattice layer; and
a second conductive type clad layer between the active layer and the second conductive type super lattice layer.

2. The semiconductor light emitting device according to claim 1,
wherein the first GaN-based layer and the AlGaN-based layer are p-type semiconductor layers, and
wherein the second GaN-based layer is an undoped semiconductor layer including a substantially p-type dopant.

3. The semiconductor light emitting device according to claim 1, wherein the cycle is periodically repeated two to twenty times.

4. The semiconductor light emitting device according to claim 1, wherein the second conductive type super lattice layer has a thickness ranging from about 20 Å to about 1000 Å.

5. The semiconductor light emitting device according to claim 1, wherein the cycle has a thickness ranging from about 10 Å to about 80 Å.

6. The semiconductor light emitting device according to claim 1,
wherein the first conductive type semiconductor layer comprises at least one n-type semiconductor layer, and
wherein the second conductive type semiconductor layer comprises at least one p-type semiconductor layer.

7. The semiconductor light emitting device according to claim 6, further comprising:
at least one of an undoped semiconductor layer, a buffer layer, and a substrate formed under the first conductive type semiconductor layer.

8. The semiconductor light emitting device according to claim 6, further comprising:
at least one of a transparent electrode layer, a second electrode, and an n-type semiconductor layer formed on the second conductive type semiconductor layer.

9. A semiconductor light emitting device, comprising:
a first conductive type semiconductor layer;
an active layer on the first conductive type semiconductor layer;
a second conductive type super lattice layer formed on the active layer and comprising a cycle of at least two semiconductor layers,
wherein the cycle of the semiconductor layers is periodically repeated two to twenty times; and
a second conductive type semiconductor layer on the second conductive type super lattice layer,
wherein a thickness of the second conductive type super lattice layer is more than 20 Å, and
wherein the second conductive type super lattice layer includes a cycle of first GaN-based layer/AlGaN-based layer/second GaN-based layer or a cycle of AlGaN-based layer/first GaN-based layer/second GaN-based layer.

10. The semiconductor light emitting device according to claim 9, wherein the cycle of the semiconductor layers comprises a GaN-based layer and a AlGaN-based layer.

11. The semiconductor light emitting device according to claim 9, further comprising:
a conductive supporting substrate on the second conductive type semiconductor layer.

12. The semiconductor light emitting device according to claim 9,
wherein the first conductive type semiconductor layer comprises at least one n-type semiconductor layer, and
wherein the second conductive type semiconductor layer comprises at least one p-type semiconductor layer.

13. The semiconductor light emitting device according to claim 11, further comprising:
a reflective layer between the conductive supporting substrate and the second conductive type semiconductor layer.

14. The semiconductor light emitting device according to claim 9, further comprising:
a second conductive type clad layer between the active layer and the second conductive type super lattice layer.

15. The semiconductor light emitting device according to claim 9, wherein the second conductive type super lattice layer has a thickness ranging from about 20 Å to about 1000 Å.

16. The semiconductor light emitting device according to claim 9, further comprising:
a transparent electrode layer formed on the second conductive type semiconductor layer.

17. The semiconductor light emitting device according to claim 9, wherein the second GaN-based layer has a band gap value larger than any other layer's band gap value within each cycle.

* * * * *